(12) United States Patent
Airaksinen et al.

(10) Patent No.: US 9,728,452 B2
(45) Date of Patent: Aug. 8, 2017

(54) METHOD FOR DEPOSITING ONE OR MORE POLYCRYSTALLINE SILICON LAYERS ON SUBSTRATE

(75) Inventors: Veli Matti Airaksinen, Espoo (FI); Jari Makinen, Espoo (FI)

(73) Assignee: OKMETIC OYJ, Vantaa (FI)

( * ) Notice: Subject to any disclaimer, the term of this patent is extended or adjusted under 35 U.S.C. 154(b) by 0 days.

(21) Appl. No.: 14/009,838

(22) PCT Filed: Mar. 30, 2012

(86) PCT No.: PCT/FI2012/050325
§ 371 (c)(1),
(2), (4) Date: Oct. 24, 2013

(87) PCT Pub. No.: WO2012/136888
PCT Pub. Date: Oct. 11, 2012

(65) Prior Publication Data
US 2014/0061867 A1    Mar. 6, 2014

(30) Foreign Application Priority Data
Apr. 4, 2011   (FI) ...................... 20115321

(51) Int. Cl.
*H01L 21/44*   (2006.01)
*H01L 21/768*   (2006.01)
*C23C 16/04*   (2006.01)
*C23C 16/24*   (2006.01)
*H01L 21/285*   (2006.01)
*H01L 23/48*   (2006.01)

(52) U.S. Cl.
CPC ...... *H01L 21/76882* (2013.01); *C23C 16/045* (2013.01); *C23C 16/24* (2013.01); *H01L 21/28556* (2013.01); *H01L 21/76879* (2013.01); *H01L 21/76898* (2013.01); *H01L 23/481* (2013.01); *H01L 2924/0002* (2013.01)

(58) Field of Classification Search
CPC .................. H01L 21/76882; H01L 23/481
USPC ............................................. 438/657
See application file for complete search history.

(56) References Cited

U.S. PATENT DOCUMENTS

| | | | |
|---|---|---|---|
| 4,882,299 A * | 11/1989 | Freeman et al. | 438/488 |
| 5,141,892 A | 8/1992 | Beinglass | |
| 5,618,752 A | 4/1997 | Gaul | |
| 5,985,729 A * | 11/1999 | Wu | 438/389 |

(Continued)

FOREIGN PATENT DOCUMENTS

| | | |
|---|---|---|
| JP | 05-62904 | 3/1993 |
| JP | 2003-178992 | 6/2003 |
| JP | 2010-226060 | 10/2010 |

OTHER PUBLICATIONS

International Search Report dated Sep. 21, 2012, corresponding to PCT/FI2012/050325.

(Continued)

*Primary Examiner* — Igwe U Anya
(74) *Attorney, Agent, or Firm* — Young & Thompson (57) ABSTRACT

A method for depositing one or more polycrystalline silicon layers (230c) on a substrate (210) by a chemical vapor deposition in a reactor, includes adjusting a deposition temperature between 605° C.-800° C. in a process chamber of the reactor, and depositing the one or more polycrystalline silicon layers on the substrate by using a silicon source gas including $SiH_4$ or $SiH_2Cl_2$, and a dopant gas including $BCl_3$.

19 Claims, 3 Drawing Sheets

(56) References Cited

U.S. PATENT DOCUMENTS

| | | | |
|---|---|---|---|
| 6,162,711 A * | 12/2000 | Ma et al. | 438/558 |
| 6,328,794 B1 * | 12/2001 | Brouillette et al. | 117/4 |
| 2002/0045009 A1 | 4/2002 | Tobashi et al. | |
| 2002/0102796 A1 * | 8/2002 | Lee et al. | 438/283 |
| 2003/0077920 A1 * | 4/2003 | Noda et al. | 438/788 |
| 2003/0087108 A1 * | 5/2003 | Herner et al. | 428/446 |
| 2003/0119288 A1 * | 6/2003 | Yamazaki et al. | 438/565 |
| 2005/0056885 A1 * | 3/2005 | Pai et al. | 257/330 |
| 2005/0066892 A1 | 3/2005 | Dip et al. | |
| 2005/0181633 A1 * | 8/2005 | Hochberg et al. | 438/787 |
| 2006/0073679 A1 * | 4/2006 | Airaksinen et al. | 438/478 |
| 2006/0097299 A1 * | 5/2006 | Ahn | H01L 28/60 257/295 |
| 2007/0048956 A1 | 3/2007 | Dip et al. | |
| 2008/0245303 A1 | 10/2008 | Yamamoto | |
| 2009/0114146 A1 | 5/2009 | Takasawa et al. | |
| 2009/0122651 A1 * | 5/2009 | Kupnik | B06B 1/0292 367/181 |
| 2009/0256258 A1 * | 10/2009 | Kreupl | H01L 21/6835 257/741 |
| 2010/0032809 A1 * | 2/2010 | Collins | H01L 23/481 257/621 |
| 2010/0102291 A1 * | 4/2010 | Xu | 257/4 |
| 2010/0203243 A1 | 8/2010 | Wang et al. | |
| 2010/0244201 A1 | 9/2010 | Kitada | |
| 2010/0255664 A1 * | 10/2010 | Khandekar et al. | 438/488 |
| 2010/0291735 A1 | 11/2010 | Ozguz et al. | |
| 2011/0269315 A1 * | 11/2011 | Hasebe | C23C 16/22 438/758 |
| 2012/0074509 A1 * | 3/2012 | Berg | B06B 1/0292 257/416 |
| 2012/0074570 A1 * | 3/2012 | Kolb | H01L 21/76898 257/751 |
| 2012/0202327 A1 * | 8/2012 | Lehnert et al. | 438/270 |

OTHER PUBLICATIONS

S. Zona, et al.; "Low Temperature Resistivity of Heavily Boron Doped LPVCD Polysilicon Thin Films"; J. Phys. D. Appl. Phys., 2008 vol. 41 pp. 162002:1-162002:5.

Finnish Search Report dated Feb. 1, 2012, corresponding to the Foreign Priority Application No. 20115321.

H. Gris, et al.; LP-CVD Silicon-Based Film Formation in Submicrometer Trenches in Industrial Equipment: Experiments and Simulation. Chem. Vap. Deposition, Koko Julkaisu; 2008, vol. 8; pp. 213-219.

Fan Ji, et al.; "Fabrication of Silicon Based Through-Wafer Interconnects for Advanced Chip Scale Packaging"; Sep. 29, 2006; pp. 405-412.

Luusua, et al.; Through-Wafer Polysilicon Interconnect Fabrication with In-Site Boron Doping; Mater. Res. Soc. Symp. Proc. vol. 872; 2005; Materials Research Society.

JP Office Action, dated Sep. 8, 2015; Application No. 2014-503183.

Ivanda et al., "Low Pressure Chemical Vapor Deposition of Different Silicon Nanostructures," MIPRO 2006 29th International Convention, May 22-26, 2009, pp. 1-6.

European search report, dated Mar. 10, 2016; Application No. 12 768 580.8.

JP Office Action, dated Jan. 26, 2016; Application No. 204-503183.

Bielle-Daspert et al., "Material and Electronic Properties of Boron-Doped Silicon Films Deposited from SiH4—BCL3—N2 Mixtures in an Industrial Low Pressure Chemical Vapour Deposition Furnace," Thin Solid Films, vol. 204, pp. 33-48, 1991.

Chandrasekaran et al., "Through-water electrical interconnects for MEMS sensors," 2000 ASME International Mechanical Engineering Congress and Exposition, Nov. 11, 2001, pp. 319-324.

\* cited by examiner

METHOD FOR DEPOSITING ONE OR MORE POLYCRYSTALLINE SILICON LAYERS ON SUBSTRATE

TECHNICAL FIELD OF THE INVENTION

The application relates generally to a method for depositing one or more polycrystalline silicon layers on a substrate.

BACKGROUND OF THE INVENTION

Thin silicon layers which have properties different from those of single crystal silicon substrates are commonly used for the processing of many types of semiconductor devices. Such layers are typically between 0.1 µm and 100 µm thick but can be even thicker than 100 µm or thinner than 0.1 µm. The layers can be single crystalline, polycrystalline, or amorphous depending on the substrate and the deposition process. The layers can be grown directly on the silicon substrate or on a suitable intermediate layer covering the substrate, e.g. an oxide or nitride layer. Instead of a single layer also multiple layers can be grown on top of each other.

In many applications it is useful to have electrical connections between the front-side and the backside of a silicon wafer. Such connections can be made e.g. by first forming holes through the wafer, then forming an insulating layer on the walls of the holes, and finally filling the holes with an electrically conductive material of sufficiently low resistivity. A suitable material is e.g. a metal or doped polycrystalline silicon. Electrical through-wafer connections are now commonly used and are called through-wafer-vias (TWV). Through-wafer-vias can also be created by first forming holes only part way through the wafer, then forming an insulating layer on the surfaces of the hole, then filling the hole with conductive material, and finally thinning the wafer from the backside to expose the bottom end of the filled hole. To be useful for many device applications the through-wafer-vias should be of sufficiently small diameter e.g. less than 50 µm or even less than 20 µm. For the electrical resistance of the through-wafer connection to be sufficiently low, the material used for filling the hole must be of low electrical resistivity; typically less than 0.01 ohm-cm or even lower.

Chemical vapour deposition (CVD) is the most commonly used method for the deposition of silicon. The CVD process utilises a silicon-containing precursor, possibly mixed with either an inert or a reducing carrier gas, e.g. nitrogen ($N_2$) or hydrogen ($H_2$). Silicon hydrides (e.g. silane $SiH_4$), silicon chlorides (e.g. silicon tetrachloride $SiCl_4$), or chlorosilicon hydrides (e.g. dichlorosilane $SiH_2Cl_2$ or trichlorosilane $SiHCl_3$) are used as silicon precursors. If the layers are thin, low temperature deposition processes below 1050° C. can be used. If the deposited layer is thick, however, e.g. over 10 µm, the deposition rate becomes important due to its effect on the throughput of the deposition equipment. At high temperatures, above about 1100° C., the CVD processes can achieve very high deposition rates of up to 5 µm/min depending on the gas flow rates, temperature, and pressure. In particular, thick epitaxial and polycrystalline silicon layers are usually deposited using a high temperature of between 1050° C. and 1200° C. and either silicon tetrachloride or trichlorosilane as the precursor. However, at low temperatures below 650° C. usually silane is the most common silicon precursor.

Polycrystalline silicon layers can be alloyed with impurity atoms to achieve suitable electrical properties of the resulting alloy. In particular, the conductivity of the layer can be adjusted with the dopants boron for p-type layers and arsenic, phosphorus, or antimony for n-type layers. Typical precursors for the dopants in the CVD process are hydrides, e.g. diborane ($B_2H_2$) for boron. $SiH_4$ is commonly used as the silicon precursor. Typical electrically active dopant atom concentrations in the grown layers are between $10^{14}$ $cm^{-3}$ and $10^{19}$ $cm^{-3}$. Both higher and lower concentrations are possible and also fairly commonly used. In principle low resistivity silicon can be used for through-wafer-vias, however there are some serious practical difficulties.

To achieve acceptable cost, high throughput and deposition rate are needed. Deposition rate can be increased using higher deposition temperature; but at temperatures above 620° C. the deposition process becomes too efficient with nearly 100% of the injected silane precursor being used growing silicon either on the wafers or the hot inner surfaces of the reactor. This inevitably tends to cause very poor uniformities of the grown layers as local deposition rates are limited by the availability of the precursor. In addition, with increasing temperature it becomes more difficult to deposit p-type silicon with low electrical resistivity, severely limiting the usefulness of such material for through-wafer-vias. For these reasons, the chemical vapour deposition of low resistivity p-type polycrystalline silicon layers is done at relatively low temperatures, typically at or below 620° C. If very low resistivity is required, the deposition is done below 600° C., and the grown layer is mostly amorphous. For the deposition of silicon at such low temperatures, using silane as a precursor for silicon and diborane ($B_2H_6$) for boron, a carrier gas is generally not used. The deposition rate of silicon is greatly reduced from that possible at high temperatures, typical values being around 5 nm/min or even less. To achieve reasonable throughput batch processing is used, with typically several tens or even hundreds of wafers being processed simultaneously in the same furnace. In such cases it becomes difficult to achieve uniform layers, with the layer thickness and resistivity exhibiting great variations, typically several tens of percent, between different wafers, and even within a single wafer. Therefore, it is not possible to find a good combination of high throughput, low cost, acceptable uniformity, and low resistivity with the typical $SiH_4/B_2H_6$ process for many through-wafer-via applications.

To remove the problems of low uniformity and high resistivity of the low temperature $SiH_4/B_2H_6$ low-pressure CVD (LPCVD) process boron trichloride has been used as the boron precursor. Noda et al. describe in U.S. Pat. No. 6,905,963 B2 an LPCVD method of growing below 600° C. boron doped polysilicon of greatly improved uniformity of layer thickness. However, according to Noda et al. above about 600° C. the specific resistance of the polycrystalline silicon increases sharply. In U.S. Pat. No. 7,419,701 B2 Herner et al. describe an LPCVD method of depositing boron doped polysilicon below 550° C. with $SiH_4$ and boron trichloride ($BCl_3$) to achieve very high B concentrations between $7*10^{20}-3*10^{21}$. Furthermore, Herner et al. describe the use of this method to deposit in-situ doped polysilicon on a sidewall of a trench on the silicon wafer.

However, the low temperature processes described by Noda et al. and Herner et al. have the disadvantage of low deposition rate and low throughput and high cost for thick boron doped polysilicon layers.

SUMMARY

Therefore, one object of the invention is to withdraw the above-mentioned drawbacks and provide a faster CVD process for depositing thick and uniform low resistivity polysilicon layers for through-wafer-vias by utilizing a higher growing temperature and halide precursors.

The object of the invention is fulfilled by providing a method of claim 1, a semiconductor structure of claim 9, and an apparatus of claim 10.

According to an embodiment a method for depositing highly boron doped one or more polycrystalline silicon layers on a substrate wafer by a chemical vapour deposition in a reactor comprises adjusting a deposition temperature between 605° C.-800° C. in a process chamber of the reactor, and depositing the one or more polycrystalline silicon layers on the substrate wafer by using a silicon source gas comprising silane ($SiH_4$) and/or dichlorosilane ($SiH_2Cl_2$), and a dopant gas comprising boron trichloride ($BCl_3$).

According to an embodiment a semiconductor structure provided by a chemical vapour deposition in a reactor that comprises one or more highly boron doped polycrystalline silicon layers deposited on the substrate wafer in a deposition temperature between 605° C.-800° C. in a process chamber of the reactor by using a silicon source gas comprising $SiH_4$ and/or $SiH_2Cl_2$, and a dopant gas comprising $BCl_3$.

According to an embodiment an apparatus comprises a semiconductor structure that is provided by a chemical vapour deposition in a reactor, wherein one or more highly boron doped polycrystalline silicon layers are deposited on the substrate wafer in a deposition temperature between 605° C.-800° C. in a process chamber of the reactor by using a silicon source gas comprising $SiH_4$ and/or $SiH_2Cl_2$, and a dopant gas comprising $BCl_3$.

Further embodiments are defined in dependent claims.

Embodiments of the invention enable to use either silane or dichlorosilane as the silicon source gas, and replace hydrides by chlorides as precursors for boron in the CVD process of boron doped polycrystalline silicon.

Embodiments of the invention also improve the process at e.g. temperatures between 620° C.-720° C. because of greatly improved uniformity and high deposition rates of over 15 nm/min, and thus reducing the deposition time and the costs.

Embodiments of the invention also enable to grow very low resistivity silicon above 620° C. using boron trichloride as the boron precursor.

These beneficial effects are mainly due to halides being more stable than hydrides.

The very low and uniform resistivity in the grown layer, when using $BCl_3$ as the dopant precursor, is particlarly advantageous when the deposition process is used for filling holes in the silicon wafer to form electically conductive paths through the wafer, i.e. TWV. The low resistivity polysilicon ensures that the electrical resistance of each TWV is sufficiently low for well functioning devices. A typical requirement for the resistance of a TWV can be on the order of 10 to 50 ohms, or even lower. Using low resistivity material for the filling of the vias makes it possible to reduce the diameter of the via, while still maintaining a sufficiently low electrical resistance, and thus reducing the lateral size of each TWV and freeing more surface area of the wafer for devices.

Thereby, the resulting wafer surface is much better suited for the manufacturing of discrete electronic devices and integrated circuits, and for semiconductor manufacturing processes, e.g. for Micro-Electro-Mechanical Systems (MEMS), Micro-Opto-Electro-Mechanical Systems (MO-EMS), or Micro System Technology (MST) applications.

The verb "to comprise" is used in this document as an open limitation that neither excludes nor requires the existence of also unrecited features. The verbs "to include" and "to have/has" are defined as to comprise.

The terms "a", "an" and "at least one", as used herein, are defined as one or more than one and the term "plurality" is defined as two or more than two.

The term "another", as used herein, is defined as at least a second or more.

The term "or" is generally employed in its sense comprising "and/or" unless the content clearly dictates otherwise.

For the above-mentioned defined verbs and terms, these definitions shall be applied, unless a different definition is given in the claims or elsewhere in this description/specification.

Finally, the features recited in depending claims are mutually freely combinable unless otherwise explicitly stated.

BRIEF DESCRIPTION OF THE FIGURES

Next, the preferred embodiments of the invention will be described with reference to the accompanying figures, in which.

DETAILED DESCRIPTION OF THE FIGURES

Figure 1:
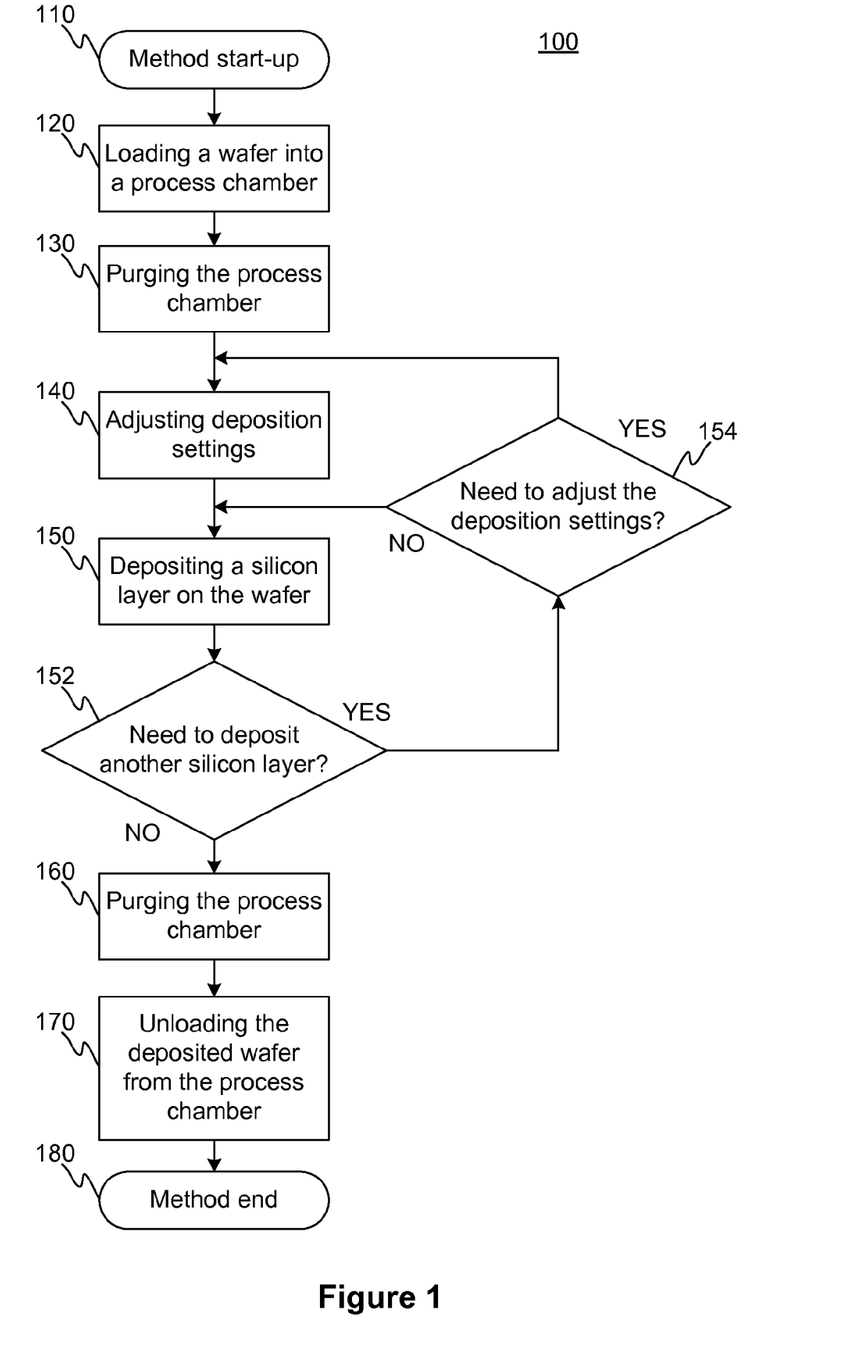
FIG. 1 illustrates an exemplary flowchart of a CVD method for depositing polycrystalline silicon.

FIG. 1 illustrates a flowchart describing a CVD method 100, which is executed by a horizontal hot-wall reactor comprising a horizontal quartz tube, i.e. a process tube that can also be made from other inert material such as silicon carbide, heated by surrounding resistive heaters, where one or more precursor gases are injected into the reactor from the front and the rear of the quartz tube. The precursor gases may be injected directly into the process tube or through small injector tubes to adjust exact locations of gas injection points.

During the method start-up in step 110, the reactor is turned on and necessary service operations, e.g. checking operations concerning a condition of the reactor and adequancy of the used reaction gases, are performed. Also, one or more substrate wafers to be deposited are arranged onto a quartz boat.

The substrate wafers comprise blank silicon wafers, e.g. unoxidized blank silicon wafers or blank silicon wafers having an insulating surface layer, e.g. oxidized blank silicon wafers having a silicon dioxide surface layer, and/or preprocessed silicon wafers, e.g. unoxidized preprocessed silicon wafers or oxidised preprocessed silicon wafers, with a number of recesses, trenches, holes, protrusions, or any other structures extending from a surface of a wafer. Alternatively, the substrate wafers can be suitable metal wafers, other semiconductor wafers, insulating wafers (e.g. quartz wafers), or any other suitable substrate material. Alternatively, the substrate to be deposited can be e.g. parts of a substrate wafers, spherical silicon, silicon sheet, etc.

According to an embodiment the method, which is disclosed in any of the previous embodiments, wherein the substrate wafer comprises at least an insulating surface layer, e.g. silicon dioxide surface layer, silicon nitride surface layer, or any other insulating surface layer. The substrate wafer can comprise e.g. a combination of at least two similar or diffent insulating layers, or any combination of at least one insulating layer and at least one conductive layer or conductors. Such layer structure can be e.g. a conductive layer or pattern, e.g. conductors, provided between two insulating layers, e.g. silicon dioxide layers, on the substrate wafer. Alternatively, such layer structure can comprise three insulating layers and two conductive layers or patterns between the insulating layers.

According to an embodiment the method, which is disclosed in any of the previous embodiments, wherein the substrate wafer comprises at least one of a recess extending part-way through the substrate wafer, a trench, a hole of aspect ratio e.g. greater than 5 extending completely through the substrate wafer, and a protrusion extending from a surface of the substrate wafer, and the one or more polycrystalline silicon layers are deposited inside the recess, trench, or hole, or on the protrusion.

Each preprosessed wafer may comprise a number of holes etched into the wafer from a front side of the wafer. A diameter and depth of the holes may vary considerably. The holes may extend part-way through the wafer or they may extend completely through the wafer. The holes are e.g. approximately 20 μm in diameter and 150 μm in depth.

The substrate wafers are stacked vertically onto the quartz boat and the boat is placed into the process tube by a transfer mechanism in step 120. Instead of one, also two or more boats can be used simultaneously. A total number of wafers loaded into the process tube depends on an uniformity of the process and a length of the process tube. The number of wafers simultaneously processed is e.g. 80 but could be 200 or even more in longer furnaces. Instead of the horizontal process tube, it is possible use a vertical furnace, i.e. a vertical reactor with wafers mounted substantially horizontally, that are widely used in the industry and a material used for the process tube and/or the boats can be other than quartz, e.g. silicon carbide.

In order to ensure substantially uniform deposition conditions for actual silicon wafers to be processed it can be used e.g. 5 wafers, i.e. so-called dummy wafers, at both ends of the quartz boat.

Prior to deposition the process tube is purged with a clean and dry purge gas, e.g. nitrogen, in step 130 to remove air and moisture from the process tube. It is also possible to use other gases than nitrogen or mixtures of gases as the purge gas.

During the purging process, or after that, a temperature of the reactor is increased and stabilized at the deposition temperature, e.g. 650° C.-700° C., in adjusting step 140. A pressure in a process chamber is usually maintained substantially below atmospheric pressure, e.g. approximately 135 mtorr, but it is also possible to apply the deposition process near or even at atmospheric pressure, or even at elevated pressures above one atmosphere.

According to an embodiment the method, which is disclosed in any of the previous embodiments, further comprises adjusting a deposition pressure below 200 mtorr in the process chamber.

According to an embodiment the method, which is disclosed in any of the previous embodiments, wherein the method comprises depositing the one or more polycrystalline silicon layers on the substrate wafer in the adjusted deposition temperature, preferably constant 680° C., and the deposition pressure between 160 mtorr-170 mtorr by using $SiH_4$ as a silicon source gas.

Naturally a part of adjustments concerning process parameters and belonging to step 140 can be performed during any of steps 110, 120, or 130.

In the deposition a reactant gas mixture comprising a silicon containing gas, e.g. $SiH_4$, a dopant gas or gases, e.g. $BCl_3$, and possibly a carrier gas containing an inert gas, e.g. argon or helium, or a reducing gas, e.g. hydrogen ($H_2$), is fed into the process tube.

According to an embodiment the method, which is disclosed in any of the previous embodiments, wherein the dopant gas comprises a mixture of $BCl_3$ and another gas comprising at least one of He, Ar, $N_2$, and $H_2$.

In step 150 the deposition starts after the temperature has stabilized at the desired deposition temperature and the purging has been completed.

In this embodiment carrier gas is not used, so, the silicon source gas, i.e. $SiH_4$, is fed into the process tube both from the front and the rear. A flow rate is adjusted to optimize a deposition rate and thickness profiles of grown layers. The flow rates are e.g. 120 sccm from the front and 30 sccm from the rear, but both higher and lower flows are possible. Boron doping is achieved by feeding e.g. a diluted mixture of 5% $BCl_3$ in argon into the process tube. However, different concentrations of $BCl_3$ are possible, e.g. more dilute mixtures or higher concentrations, even pure 100% $BCl_3$ can be used. In addition, other inert gases than argon, or mixtures of inert gases may be used to dilute the $BCl_3$. The flow rate of the boron-containing doping gas is adjusted to obtain the desired concentration of boron in the grown layer, e.g. $BCl_3$:Ar is injected into the process tube from the front with the flow rate of 30 sccm and from the rear at 39 sccm.

During deposition step 150 the temperature and the gas flows can be maintained constant or they may be varied by changing continuously or discontinuously e.g. the temperature, the gas flows, and/or the pressure during the deposition according to a predetermined schedule to produce a more complicated doped layer structure.

A single layer is grown during one deposition run, so, the deposition is continued until the desired thickness of silicon has been grown onto the wafers, e.g. the total thickness of deposited silicon is approximately 2 μm. The deposition is terminated by switching off the silicon and boron comprising gases.

If there is a need for another silicon layer in step 152, but no need to adjust the process parameters in step 154 since the next layer has similar process parameters as the previous layer, i.e. temperature, the composition of the gas flows, and the flow rates are maintained constant, the method returns back to step 150. Secondly, if it is necessary to adjust the process parameters according to a predetermined schedule to produce a more complicated doped layer structure, the method returns back to step 140. Such complicated doped layer structure may comprise a number of layers each of which is grown using different process parameters. The values of these parameters may be constant in each sublayer or they may be continuously changed.

According to an embodiment the method, which is disclosed in any of the previous embodiments, wherein the reactor is a horizontal hot-wall reactor, and at least one polycrystalline silicon layer is deposited in the deposition temperature between 605° C.-650° C. and at least one polycrystalline silicon layer is deposited in the deposition temperature between 650° C.-750° C.

According to an embodiment the method, which is disclosed in any of the previous embodiments, wherein the reactor is a vertical reactor and at least one polycrystalline silicon layer is deposited in the deposition temperature between 605° C.-650° C. and at least one polycrystalline silicon layer is deposited in the deposition temperature between 650° C.-750° C.

When the deposition is completed in step 152, the process tube is purged in step 160 with a purge gas, e.g. nitrogen. During purging the temperature of the process tube is reduced prior to unloading the wafers. After the purging is completed the transfer mechanism moves the boat out of the process tube for unloading the wafers in step 170 and the method ends in step 180.

The maximum thickness of silicon that can be grown in a single deposition run is limited by silicon deposition onto the boat used for holding the wafers in the process tube. When the deposited layer becomes too thick, the wafer becomes fastened onto the boat, causing a defected area at the wafer edge when wafers are removed from the boat after the polysilicon deposition. Therefore, it is practically difficult to grow very thick polysilicon layers in such a process while maintaining a sufficient edge quality of the wafers.

In the present deposition method the maximum layer thickness is about 3 μm, so, for filling larger holes of more than a few μm in diameter, several depositions are made sequentially. Between the deposition runs the wafers can be taken out of the boat, rotated, and placed in a different part of the boat. With a suitable combination of rotation and re-placement the thickness uniformity of the final polysilicon layer is greatly improved. Thus, in the present deposition method 20 μm diameter holes are filled with 7 deposition runs for a total of 14 μm of deposited multi-layer boron-doped polysilicon.

However, when wafers are processed with several sequential deposition runs, the deposition parameters need not be identical in each run. For the filling of large aspect ratio holes it is possible to use different parameters for the last depositions to ensure the most complete filling of the holes without causing the formation of an excessively large void inside the via. Thus, in another embodiment of the present method, after 4 deposition runs of doped/undoped multilayer polysilicon, the final filling of the holes is completed with 4 runs of undoped polysilicon grown with $SiH_4$ at a lower temperature of 620° C. to fill the holes as completely as possible.

Other embodiments for the present deposition method is that the carrier gas is used and it comprises $H_2$, $N_2$, Ar, He, or a mixture of one or more of these gases. Also, a used silicon precursor can comprise $SiH_2Cl_2$.

Figure 2A:
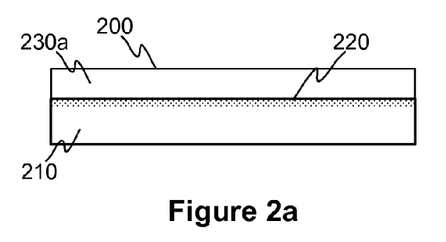
FIGS. 2a-2c illustrate exemplary views of a semiconductor structure comprising a deposited polycrystalline silicon.
Figure 2B:
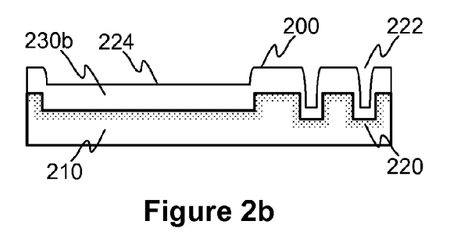
Figure 2C:
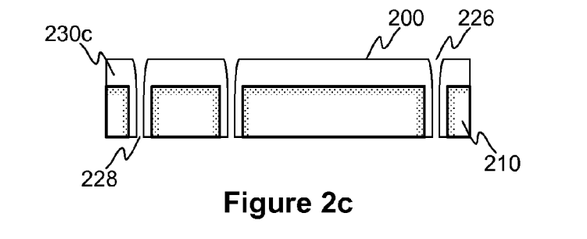

FIGS. 2a-2c illustrate cross-sections of deposited semiconductor wafer structures 200 that are processed in accordance with the present deposition method.

In FIG. 2a is a cross-section of a deposited structure 200 that comprises a blank silicon wafer 210 with an insulating surface layer 220, e.g. silicon dioxide, and single doped or undoped polycrystalline silicon 230a deposited on top of the insulating layer 220. Alternatively, the silicon wafer 210 may lack the insulating surface layer 220. The polycrystalline silicon 230a is a single layer deposited by one deposition run or multilayer silicon deposited by several similar deposition runs having similar process parameters or deposition runs where at least one of the deposition runs is provided by different process parameters than other deposition runs.

According to an embodiment the semiconductor structure, which is disclosed in any of the previous embodiments, wherein the substrate wafer comprises at least an insulating surface layer, e.g. silicon dioxide surface layer or any other insulating layer.

FIG. 2b illustrates a cross-section of a deposited structure 200 having a preprocessed silicon wafer 210 with an insulating layer 220 on a top surface of the silicon wafer 210. The silicon wafer 210 comprises two recesses 222 and a single trench 224 that extend partly through the substrate wafer 210 and that have been deposited by several deposition runs so that multilayer polycrystalline silicon 230b filling the recesses 222 and the trench 224 comprises doped polysilicon layers and undoped polysilicon layers in turn.

In order to provide two vias, the deposited structure 200 can be thinned from a bottom of the silicon wafer 210 such that the recesses 222 forms the vias when the silicon wafer 210 is thinned sufficiently.

According to an embodiment the semiconductor structure, which is disclosed in any of the previous embodiments, wherein the substrate wafer comprises at least one of a recess extending part-way through the substrate wafer, a trench, a hole of aspect ratio e.g. greater than 5 extending completely through the substrate wafer, and a protrusion extending from a surface of the substrate wafer, and the one or more polycrystalline silicon layers are deposited inside the recess, trench, or hole, or on the protrusion.

In one embodiment the deposition temperature is maintained constant at 680° C. through the entire deposition and the silane flow rates are also maintained constant. The dopant gas BCl3:Ar, for one, is switched on and off to produce a stack of thin doped and undoped layers. Such multilayer structure 230b is advantageous because the growth rate of the undoped layer is faster than that of the doped layer, thus decreasing the overall deposition time. On the other hand, the highly doped layer ensures a low and very uniform overall resistivity in the doped/undoped layer stack of the polycrystalline silicon 230b. In this embodiment the deposition starts with a doped layer and an equal number, e.g. 9, 11, or 13, of doped and undoped layers is grown. The deposition time for each doped layer is 4 minutes, and for each undoped layer 6 minutes. Naturally, it is possible to provide the doped/undoped layer stack having different number of doped and undoped layers, e.g. 9 doped layers and 8 undoped layers.

It is also possible that each deposited doped and/or undoped polycrystalline silicon layer has been provided by different process parameters so that the multilayer structure 230b comprises no identical undoped/doped silicon layers.

According to an embodiment the semiconductor structure, which is disclosed in any of the previous embodiments, wherein the reactor is a horizontal hot-wall reactor, and at least one polycrystalline silicon layer is deposited in the deposition temperature between 605° C.-650° C. and at least one polycrystalline silicon layer is deposited in the deposition temperature between 650° C.-750° C.

According to an embodiment the semiconductor structure, which is disclosed in any of the previous embodiments, wherein the reactor is a vertical reactor and at least one polycrystalline silicon layer is deposited in the deposition temperature between 605° C.-650° C. and at least one polycrystalline silicon layer is deposited in the deposition temperature between 650° C.-750° C.

FIG. 2c illustrates a cross-section of a deposited structure 200 having a preprocessed silicon wafer 210 with an insulating layer 220 and three holes 226 that extend completely through the silicon wafer 210. The holes 226 with narrow voids 228 are filled with multilayer polycrystalline silicon 230c having several doped and/or undoped polysilicon layers. It is also possible to fill the holes 226 completely with the multilayer polycrystalline silicon 230c.

Naturally all silicon wafers 210 can have recesses, trenches, holes, and/or protrusions also on its bottom surface.

In one embodiment the oxidised preprocessed silicon wafer 210 of 150 mm diameter comprising holes 226 of aspect ratio greater than 7 with a diameter of about 20 μm and a depth of at least 150 μm that partly or completely extend through the silicon wafer 210. The multilayer silicon is grown at constant temperature of 680° C. and pressure about 165 mtorr with no carrier gas.

According to an embodiment the semiconductor structure, which is disclosed in any of the previous embodiments, wherein the one or more polycrystalline silicon layers are deposited in a deposition pressure below 200 mtorr in the process chamber.

According to an embodiment the semiconductor structure, which is disclosed in any of the previous embodiments, wherein the one or more polycrystalline silicon layers is deposited on the substrate wafer at the deposition temperature, preferably constant 680° C., and the deposition pressure between 160 mtorr-170 mtorr by using $SiH_4$ as a silicon source gas.

A used silicon precursor is $SiH_4$ with a flow rate of 120 sccm from the front and 30 sccm from the rear and a boron precursor is a 5% mixture of $BCl_3$ in the inert gas argon having flow rates 30 sccm from the front and 39 sccm from the rear.

According to an embodiment the semiconductor structure, which is disclosed in any of the previous embodiments, wherein the used dopant gas comprises a mixture of $BCl_3$ and another gas comprising at least one of He, Ar, $N_2$, and $H_2$.

A single layer is grown during one deposition run with a deposition rate about 15 nm/min so that the deposition process results about 2 μm thick boron doped polycrystalline silicon layers having electrical resistivity below 5 milliohm-cm so that a total deposited thickness in 6 deposition runs is about 12 μm. The layers are deposited inside the holes with excellent uniformity and conformality, and the holes are substantially filled such that a central void that is less than 1 μm, even less than 200 nm, in diameter.

In other embodiments layers are grown at temperature e.g. between 700° C.-800° C., and a multilayer structure can comprise e.g. layers grown at a lower temperature below 650° C. and/or layers grown at a higher temperature of 750° C.-800° C. It is also possible to a grown polysilicon layer having a resistivity of 5-10 milliohm-cm.

Figure 3A:
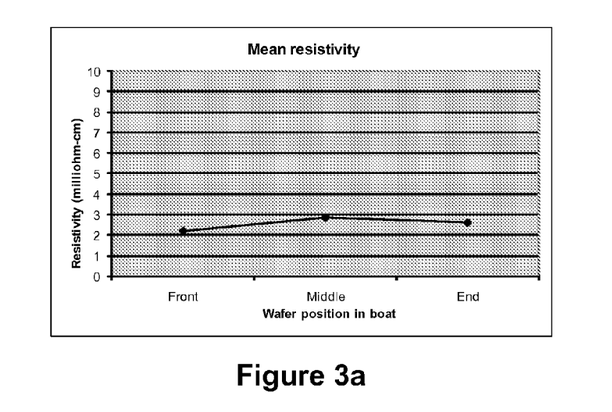
FIGS. 3a-3b illustrate exemplary measurement results relating to how a wafer position in a boat effects to resistivity of wafers, FIG. 4 illustrate exemplary views of a process for providing a semiconductor sensor structure comprising a deposited polycrystalline silicon.

FIG. 3a illustrates mean resistivity values of three substrate wafers that have been processed according to the present CVD method. The substrate wafers located at the front, middle, and end of an 80 wafer boat during the process. As one can see from the figure, a substrate wafer processed in the middle of the boat has a slightly higher resistivity than substrate wafers processed in the ends of the boat. However, all wafers exhibit a very low value of resistivity below 3 milliohm-cm.

Figure 3B:
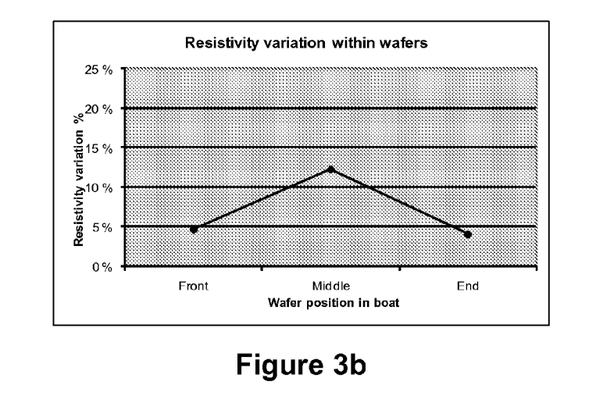

Similarly, FIG. 3b illustrates the resistivity variation within each of the substrate wafers in the 80 wafer boat. The variation within the wafer processed at the front of the boat is 4.6%, in the middle 12.2%, and at the end 4.0%.

Figure 4:
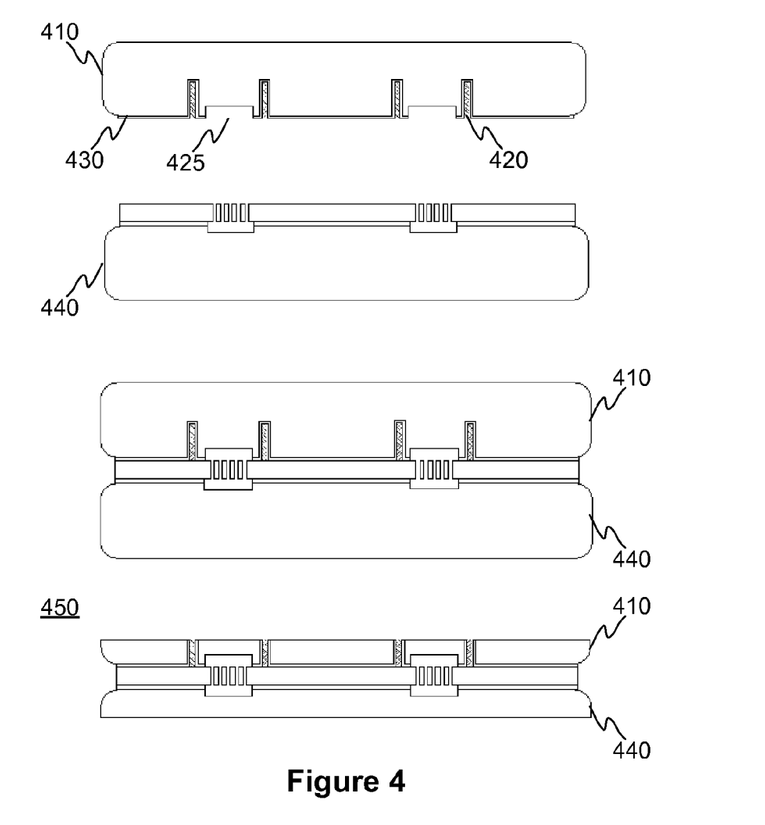

FIG. 4 illustrates a process where a substrate wafer 410, e.g. a silicon wafer, which comprises holes 420 filled with e.g. doped polycrystalline silicon and cavities 425 that extend partly through the substrate wafer 410, and a silicon dioxide layer 430 as an insulating layer, is bonded with a CSOI wafer 440 having a sensor structure for providing a wafer stack. The CSOI wafer 440 is an engineered SOI wafer having buried cavities or structures in the SOI wafer. Alternatively, it is possible to use a SOI wafer or any other wafer as a wafer 440 in order to obtain a desired sensor structure.

After the bonding operation, a thickness of the wafer stack comprising the substrate wafer 410 acting as a cap wafer and the CSOI wafer 440 is reduced by wafer thinning so that the holes 420 provides through way vias to complete a semiconductor sensor structure 450 that can be used e.g. in accelerometers and gyroscopes.

Figure 5:
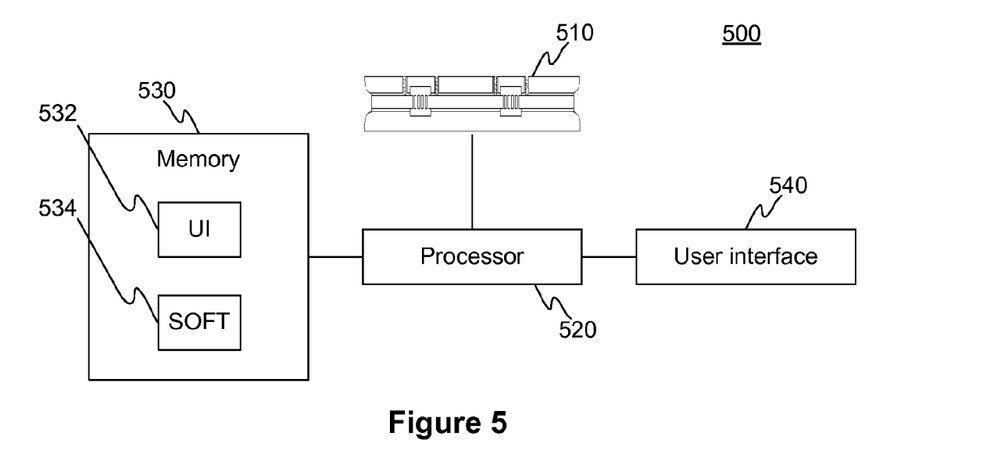
FIG. 5 illustrates an exemplary view of an apparatus having a semiconductor structure comprising a deposited polycrystalline silicon.

FIG. 5 illustrates an apparatus 500, e.g. a mobile phone, game controller, digital camera, or laptop, that comprises at least one semiconductor sensor structure 510, e.g. an accelerometer used for determining a movement of the apparatus 500, of which structure is obtained by means of a chemical vapour deposition, where one or more highly boron doped polycrystalline silicon layers are deposited in a deposition temperature between 605° C.-800° C. by using a silicon source gas comprising $SiH_4$ and/or $SiH_2Cl_2$, and a dopant gas comprising $BCl_3$.

According to an embodiment the apparatus, which is disclosed in any of the previous embodiments, wherein the one or more polycrystalline silicon layers are deposited in a deposition pressure below 200 mtorr in the process chamber.

According to an embodiment the apparatus, which is disclosed in any of the previous embodiments, wherein the used dopant gas comprises a mixture of $BCl_3$ and another gas comprising at least one of He, Ar, $N_2$, and $H_2$.

According to an embodiment the apparatus, which is disclosed in any of the previous embodiments, wherein the one or more polycrystalline silicon layers is deposited on the substrate wafer at the deposition temperature, preferably constant 680° C., and the deposition pressure between 160 mtorr-170 mtorr by using $SiH_4$ as a silicon source gas.

According to an embodiment the apparatus, which is disclosed in any of the previous embodiments, wherein the reactor is a horizontal hot-wall reactor, and at least one polycrystalline silicon layer is deposited in the deposition temperature between 605° C.-650° C. and at least one polycrystalline silicon layer is deposited in the deposition temperature between 650° C.-750° C.

According to an embodiment the apparatus, which is disclosed in any of the previous embodiments, wherein the reactor is a vertical reactor and at least one polycrystalline silicon layer is deposited in the deposition temperature between 605° C.-650° C. and at least one polycrystalline silicon layer is deposited in the deposition temperature between 650° C.-750° C.

According to an embodiment the apparatus, which is disclosed in any of the previous embodiments, wherein the substrate wafer comprises at least one of a recess extending part-way through the substrate wafer, a trench, a hole of aspect ratio e.g. greater than 5 extending completely through the substrate wafer, and a protrusion extending from a surface of the substrate wafer, and the one or more polycrystalline silicon layers are deposited inside the recess, trench, or hole, or on the protrusion.

According to an embodiment the apparatus, which is disclosed in any of the previous embodiments, wherein the substrate wafer comprises at least an insulating surface layer, e.g. silicon dioxide surface layer or any other insulating layer.

The apparatus 500 comprises also a processor 520 that is adapted to perform instructions and handling data, a memory unit 530 in order to store data, e.g. instructions and application data, a user interface 540, which comprises means for inputting commands, e.g. buttons, keyboard, and/or touch pad. In addition, the apparatus may 500 comprise a display, data transfer means for transmitting and receiving data, and a loudspeaker.

In the memory unit 530 is stored at least a user interface application for controlling the the user interface 540 with the processor 520 and software for handling information received from the sensor structure 510 and for determining by the received information e.g. the movement of the apparatus 500, with the processor 520.

The invention has been now explained above with reference to the aforesaid embodiments and the several advantages of the invention have been demonstrated. It is clear that the invention is not only restricted to these embodiments, but comprises all possible embodiments within the spirit and scope of the invention thought and the following patent claims.

The invention claimed is:

1. A method (100) for forming an electrically conductive via through a substrate (210 410) by a chemical vapour deposition in a reactor, the substrate comprising a hole (226, 420) having aspect ratio greater than 7 in the substrate, the method comprising:
    adjusting (140) a deposition temperature between 605° C.-800° C. and a deposition pressure below 200 mtorr in a process chamber of the reactor, and
    depositing (150) one or more polycrystalline silicon layers (230a, 230b, 230c) inside the hole by using a silicon source gas comprising $SiH_4$ or $SiH_2Cl_2$, and a dopant gas comprising $BCl_3$ so that the one or more polycrystalline silicon layers are deposited directly on a surface of the substrate or a surface of an insulation layer (220) inside the hole in order to form the electrically conductive via through the substrate, wherein the maximum layer thickness of each of the one or more polycrystalline silicon layers is about 3 micrometers.

2. The method of claim 1, wherein the dopant gas comprises a mixture of $BCl_3$ and another gas comprising He, Ar, $N_2$, or $H_2$.

3. The method of claim 2, wherein the method comprises depositing the one or more polycrystalline silicon layers on the substrate in the adjusted deposition temperature and a deposition pressure between 160-170 mtorr by using $SiH_4$ as a silicon source gas.

4. The method of claim 2, wherein the substrate further comprises a protrusion extending from a surface of the substrate, and the one or more polycrystalline silicon layers are deposited on the protrusion.

5. The method of claim 1, wherein the method comprises depositing the one or more polycrystalline silicon layers on the substrate in the adjusted deposition temperature and a deposition pressure between 160-170 mtorr by using $SiH_4$ as a silicon source gas.

6. The method of claim 5, wherein the substrate further comprises a protrusion extending from a surface of the substrate, and the one or more polycrystalline silicon layers are deposited on the protrusion.

7. The method of claim 5, wherein the substrate comprises at least an insulating surface layer.

8. The method of claim 1, wherein the reactor is a horizontal hot-wall reactor, and at least one polycrystalline silicon layer is deposited in the deposition temperature between 605° C.-650° C. and at least one polycrystalline silicon layer is deposited in the deposition temperature between 650° C.-750° C.

9. The method of claim 8, wherein the substrate further comprises a protrusion extending from a surface of the substrate, and the one or more polycrystalline silicon layers are deposited on the protrusion.

10. The method of claim 8, wherein the substrate comprises at least an insulating surface layer.

11. The method of claim 1, wherein the reactor is a vertical reactor and at least one polycrystalline silicon layer is deposited in the deposition temperature between 605° C.-650° C. and at least one polycrystalline silicon layer is deposited in the deposition temperature between 650° C.-750° C.

12. The method of claim 11, wherein the substrate further comprises a protrusion extending from a surface of the substrate, and the one or more polycrystalline silicon layers are deposited on the protrusion.

13. The method of claim 1, wherein the substrate further comprises a protrusion extending from a surface of the substrate, and the one or more polycrystalline silicon layers are deposited on the protrusion.

14. The method of claim 1, wherein the substrate comprises at least an insulating surface layer.

15. A semiconductor structure (200) comprising:
    a substrate (210, 410), which comprises
    a hole (226, 420) having aspect ratio greater than 7 in the substrate, and
    one or more polycrystalline silicon layers (230a, 230b, 230c) deposited inside the hole and directly on a surface of the substrate or a surface of an insulation layer (220) that is provided by the method of claim 1 and forming an electrically conductive via through the substrate, wherein the maximum layer thickness of the one or more polycrystalline silicon layers is about 3 micrometers.

16. An apparatus (500) comprising the semiconductor structure (200) of claim 15, wherein the maximum layer thickness of the one or more polycrystalline silicon layers is 3 micrometers.

17. The method of claim 1, wherein at least one polycrystalline silicon layer is deposited in the deposition temperature between 605° C.-650° C. and at least one polycrystalline silicon layer is deposited in the deposition temperature between 650° C.-750° C.

18. The method of claim 1, wherein,
    the substrate is a silicon substrate with an unoxidized silicon surface inside the hole or an oxidized silicon surface inside the hole, and
    the one or more polycrystalline silicon layers (230a, 230b, 230c) are deposited directly on the unoxidized silicon surface inside the hole or the oxidized silicon surface inside the hole.

19. A method (100) for forming an electrically conductive via through a substrate (210 410) by a chemical vapour deposition in a reactor, the substrate comprising a hole (226, 420) in the substrate, the method comprising:
    adjusting (140) a deposition temperature between 605° C.-800° C. and a deposition pressure below 200 mtorr in a process chamber of the reactor, and depositing (150) one or more polycrystalline silicon layers (230a, 230b, 230c) inside the hole by using a silicon source gas comprising $SiH_4$ or $SiH_2Cl_2$, and a dopant gas comprising $BCl_3$ so that the one or more polycrystalline silicon layers are deposited directly on a surface of the substrate or a surface of an insulation layer (220) inside the hole in order to form the electrically conductive via through the substrate, wherein at least one polycrystalline silicon layer is deposited in the deposition temperature between 605° C.-650° C. and at least one polycrystalline silicon layer is deposited in the deposition temperature between 650° C.-750° C.

\* \* \* \* \*